US011035035B2

(12) United States Patent
Eriksson et al.

(10) Patent No.: US 11,035,035 B2
(45) Date of Patent: Jun. 15, 2021

(54) ALCRN-BASED COATING PROVIDING ENHANCED CRATER WEAR RESISTANCE

(71) Applicant: Oerlikon Surface Solutions AG, Pfäffikon, Pfäffikon (CH)

(72) Inventors: Anders Olof Eriksson, Chur (CH); Mirjam Arndt, Bad Ragaz (CH); Sebastian Stein, Achern (DE)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 439 days.

(21) Appl. No.: 15/538,583

(22) PCT Filed: Dec. 3, 2015

(86) PCT No.: PCT/EP2015/078553
§ 371 (c)(1),
(2) Date: Jun. 21, 2017

(87) PCT Pub. No.: WO2016/102170
PCT Pub. Date: Jun. 30, 2016

(65) Prior Publication Data
US 2018/0044773 A1    Feb. 15, 2018

(30) Foreign Application Priority Data
Dec. 22, 2014   (DE) .......................... 102014018915.5

(51) Int. Cl.
*C23C 14/06*    (2006.01)
*C23C 14/32*    (2006.01)
(Continued)

(52) U.S. Cl.
CPC ...... *C23C 14/0647* (2013.01); *C23C 14/0021* (2013.01); *C23C 14/024* (2013.01);
(Continued)

(58) Field of Classification Search
CPC ... C23C 14/0647; C23C 14/024; C23C 28/42; C23C 28/044
See application file for complete search history.

(56) References Cited

U.S. PATENT DOCUMENTS

| 5,976,716 A * | 11/1999 | Inspektor | C23C 14/022 407/119 |
| 2007/0218242 A1 | 9/2007 | Moriguchi et al. | |
| 2015/0203956 A1* | 7/2015 | Asari | C23C 30/005 428/216 |

FOREIGN PATENT DOCUMENTS

| CN | 1384218 A | 12/2002 |
| CN | 102149844 A | 8/2011 |

(Continued)

OTHER PUBLICATIONS

International Search Report dated Feb. 25, 2016 in parent application PCT/EP2015/078553.
(Continued)

*Primary Examiner* — Laura A Auer
(74) *Attorney, Agent, or Firm* — Polson Intellectual Property Law, PC; Margaret Polson; Christopher Sylvain

(57) ABSTRACT

Coating (210) deposited on a surface of a substrate (201) comprising a multi-layered film (216) consisting of a plurality of A-layers and a plurality of B-layers deposited alternating one on each other forming a A/B/A/B/A . . . architecture, the A-layers comprising aluminium chromium boron nitride and the B-layers comprising aluminium chromium nitride and not comprising boron, whereas the multi-layered film (216) comprises at least a first portion (216a) and a last portion (216c), wherein the average boron content in the first coating portion (216a) is higher than the average boron content in the last coating portion (216c), and both the first coating portion (216a) and the last coating portion (216c) exhibit inherent compressive stresses and wherein the
(Continued)

inherent compressive stress in the first coating portion (216*a*) is lower than it in the last coating portion (216*c*).

16 Claims, 6 Drawing Sheets

(51) Int. Cl.
    *C23C 28/04*     (2006.01)
    *C23C 14/02*     (2006.01)
    *C23C 14/00*     (2006.01)
    *C23C 28/00*     (2006.01)

(52) U.S. Cl.
    CPC ........ *C23C 14/0641* (2013.01); *C23C 14/325* (2013.01); *C23C 28/042* (2013.01); *C23C 28/044* (2013.01); *C23C 28/42* (2013.01)

(56) References Cited

FOREIGN PATENT DOCUMENTS

| | | | |
|---|---|---|---|
| CN | 102725434 A | 10/2012 | |
| EP | 1174528 A2 | 1/2002 | |
| JP | 2006043874 A | 2/2006 | |
| JP | 2007126714 A | 5/2007 | |
| RU | 2090312 C1 | 9/1997 | |
| RU | 2228387 C2 | 5/2004 | |
| RU | 2010129058 A | 1/2012 | |
| WO | WO-2013000557 A1 * | 1/2013 | ......... C23C 14/0641 |
| WO | 2013156131 A1 | 10/2013 | |
| WO | WO-2014025057 A1 * | 2/2014 | ........... C23C 30/005 |

OTHER PUBLICATIONS

Written Opinion dated Feb. 25, 2016 in parent application PCT/EP2015/078553.
Office Action dated Jun. 26, 2018 in related Chinese application CN 201580068327.5.
Office Action dated Jun. 5, 2019 in related Russian application RU217126262.
Office Action dated Aug. 1, 2019 in related Japanese application 2017-533834.
Office Action dated Jan. 23, 2020 in related Brazilian application BR112017013434-92.

* cited by examiner

ALCRN-BASED COATING PROVIDING ENHANCED CRATER WEAR RESISTANCE

The present invention relates to an AlCrN-based coating which exhibits outstanding crater wear resistance in dry machining operations such as hobbing.

STATE OF THE ART

Figure 1:
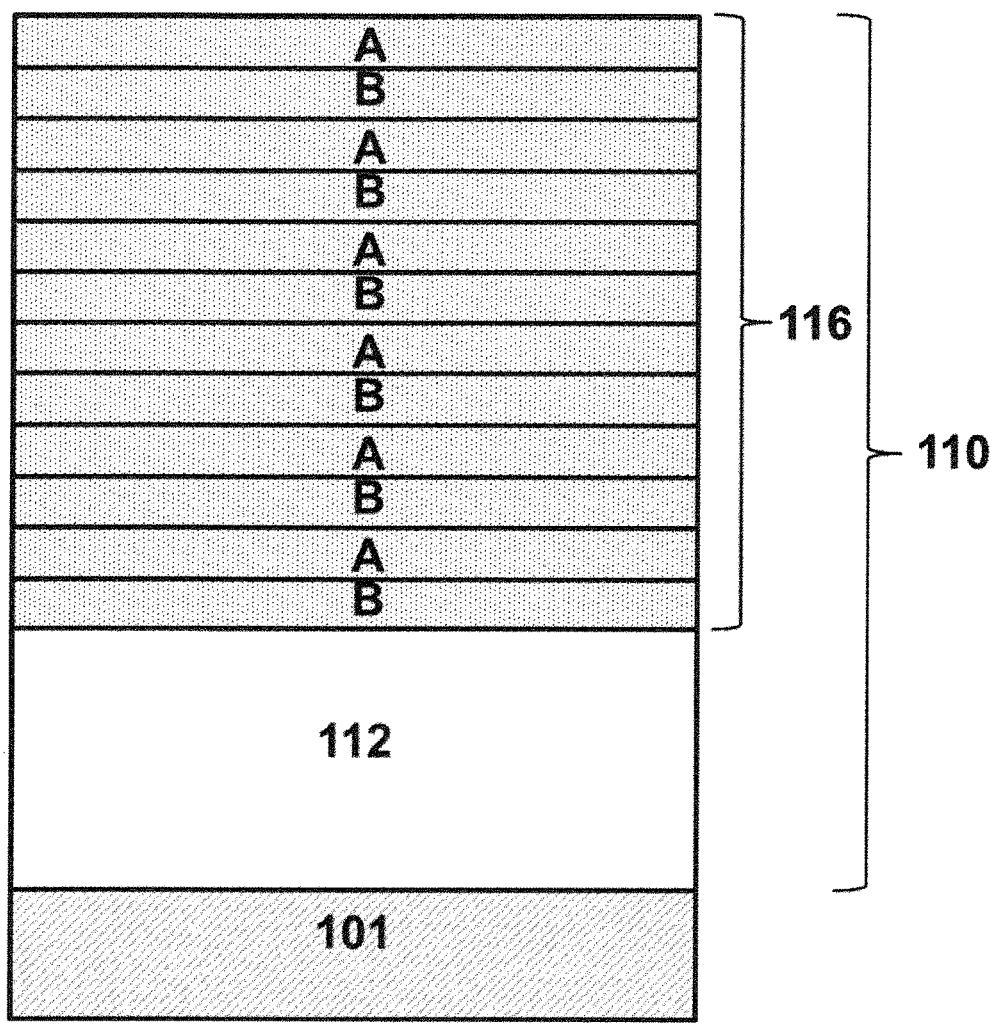
Figure 2:
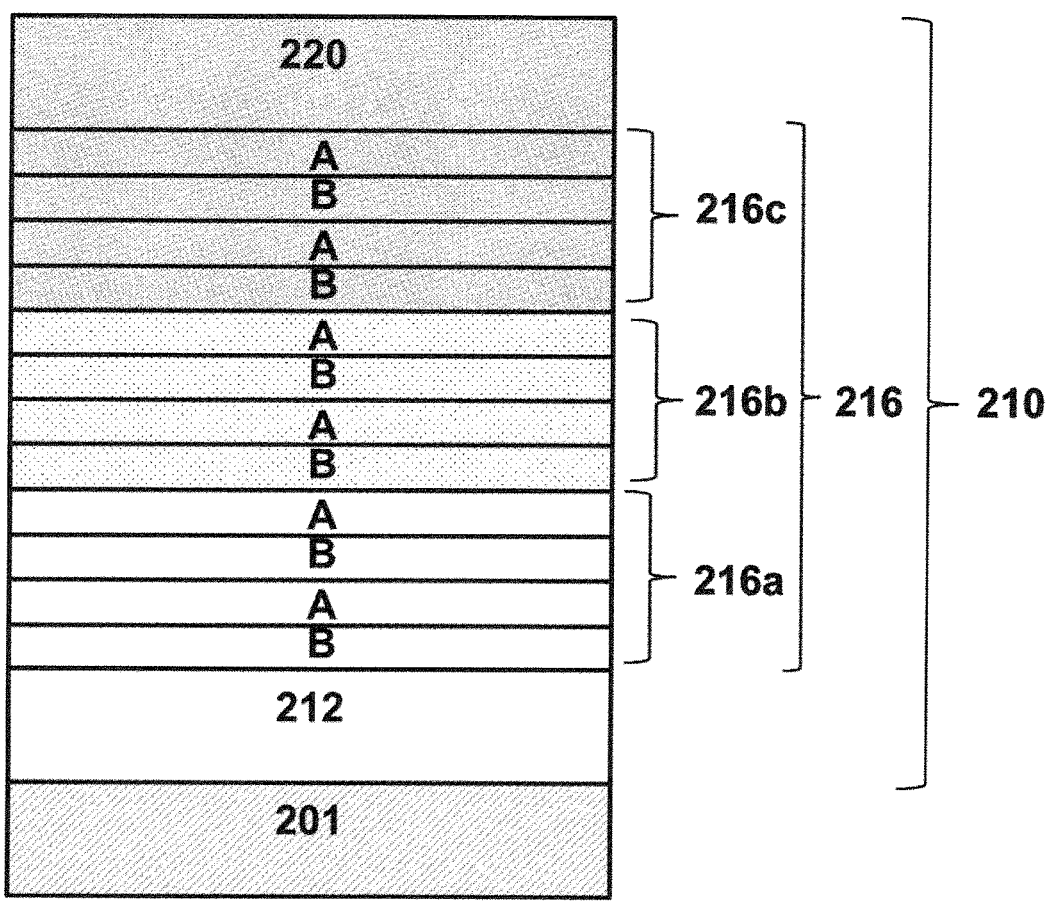

Arndt et al propose in WO2013156131A1 a coating for reducing crater wear of cutting tools by machining operations, which should be particularly beneficial in dry machining operations such as hobbing. FIG. 1 shows a view of a coating 110 according to WO2013156131A1 which comprises at least one multi-layered film 116 formed of alternated A- and B-nanolayers deposited one on each other characterized in that the A-nanolayers contain aluminium chromium boron nitride and the B-nanolayers contain aluminium chromium nitride and do not contain boron. According to the description in WO2013156131A1 the coating 110 exhibits a particularly good performance for machining operations if the A-nanolayers consist of aluminium chromium boron nitride and the B-nanolayers consist of aluminium chromium nitride. WO2013156131A1 teaches too that the use of a base layer 112 consisting of aluminium chromium nitride should be also beneficial, especially if the base layer 112 is deposited in such a way that during the deposition a bias voltage is applied and varied from a lowest value to a highest value. Moreover WO2013156131A1 teaches that a negative bias voltage not lower than 70 V in absolute value should be beneficial for the deposition of the A-nanolayers containing boron because in this way the necessary combination of high density and low thermal conductivity of the boron-containing layers can be attained.

However, in spite of the benefits attained with the above mentioned coating as well as with other currently available coatings, there is still a need for new coatings exhibiting enhanced properties which can be suitable to meet the growing demands in diverse machining operations and particularly in dry machining operations such as hobbing.

Objective of the Present Invention

The objective of the present invention is to provide an AlCrN-based coating which in comparison with known coatings allows a significant reduction of crater wear and flank wear and in this way significantly increasing cutting performance and tool life of cutting tools used in diverse machining operations, particularly in dry machining operations such as hobbing. Furthermore, it is an objective of the present invention to provide a method for manufacturing of substrates, in particular cutting tools, coated with a coating according to the present invention.

DESCRIPTION OF THE INVENTION

The objective of the present invention was achieved by providing a coating 210 according to claim 1 comprising a multi-layered film 216 consisting of a plurality of A-layers and a plurality of B-layers deposited alternatingly one on each other forming a A/B/A/B/A . . . architecture, the A-layers comprising aluminium chromium boron nitride and the B-layers comprising aluminium chromium nitride and not comprising boron, wherein the coating 210 is deposited in such a manner that the multi-layered film 216 comprises at least a first portion 216a and a last portion 216c, wherein the average boron content in the first portion 216a is higher than the average boron content in the last portion 216c.

According to the present invention the first coating portion 216a of the multi-layered film 216 exhibits negative residual stresses and the residual stress in the coating portion 216a is in absolute value lower than it in the last coating portion 216c. In the context of the present invention, the negative residual stress will be also called inherent compressive stress.

According to a preferred embodiment of a coating according to the present invention, the average boron content in the first portion 216a is at least 1.2-times higher than the average boron content in the last portion 216c. More preferably, the average boron content in the first portion 216a is at least 1.4-times higher than the average boron content in the last portion 216c.

According to a further preferred embodiment of a coating according to the present invention, the average boron content in the first portion 216a is at the most 6-times higher than the average boron content in the last portion 216c.

As aforementioned a multi-layered film 216 according to the present invention comprises at least a first portion 216a and a last portion 216c, however depending of the application, it could be beneficial that the multi-layered film 216 comprise additionally one or more middle portions 216b deposited between the first portion 216a and the last portion 216c whose inherent compressive stress is higher than the inherent compressive stress of the first portion 216a and preferably but not mandatory lower than the inherent compressive stress of the last portion 216c.

According to a further embodiment of the present invention the inherent compressive stress in one or more middle portions 216b is the same or higher than in the last portion 216c.

In a coating 210 according to the present invention the first or lower portion 216a of the multi-layered film 216 is deposited closer to the substrate 201 while the last portion or upper portion 216c is deposited directly atop of the first portion 216a or atop of a last middle portion 216b of the multi-layered film 216.

According to a preferred embodiment of a coating 210 with a multi-layered film 216 comprising only a first portion 216a and a last portion 216c, the thickness of the first portion 216a is preferably about 40% to 90% of the overall thickness of the multi-layered film 216.

According to a further preferred embodiment of a coating 210 with a multi-layered film 216 comprising additionally one or more middle portions 216b, the thickness of the first portion 216a is preferably about 20% to 80% of the overall thickness of the multi-layered film 216.

Surprisingly, by using a negative bias voltage lower than 70 V in absolute value for depositing the first portion 216a of the multi-layered film 216 and a negative bias voltage of at least 90 V or higher in absolute value for depositing the last portion 216c of the multi-layered film 216, it was possible to produce coatings which provide considerable enhanced cutting performance of coated tools used in dry machining operations in comparison with coatings according to the state of the art.

Particularly good results were obtained by using a negative bias voltage lower than 50 V in absolute value for depositing the first portion 216a of the multi-layered film 216 and a negative bias voltage of at least 100 V or higher in absolute value for depositing the last portion 216c of the multi-layered film 216

In a preferred embodiment of a coating 210 according to the present invention, the A-layers in the multi-layered film 216 have an element composition without considering contaminations which is given by the formula $(Al_xCr_yB_z)N$, where x>0, y>0 and z>0 are respectively the concentration of aluminium, chromium and boron in atomic percentage if only aluminium, chromium and boron are considered for the evaluation of the element composition in the corresponding A-layers.

In a further preferred embodiment of a coating according to the present invention, the B-layers in the multi-layered film 216 have an element composition without considering contaminations which is given by the formula $(Al_vCr_w)N$, where v>0 and w>0 are respectively the concentration of aluminium and chromium in atomic percentage if only aluminium and chromium are considered for the evaluation of the element composition in the corresponding B-layers.

According to a further preferred embodiment of an inventive coating, the coefficients x, y and z in the A-layers meet the conditions $1 \leq x/y \leq 4.5$ and/or $0.01 \leq z \leq 30$.

According to a preferred embodiment of an inventive coating, the coefficients v and w in the B-layers meet the condition $1 \leq v/w \leq 4.5$.

In a preferred embodiment of a coating according to the present invention the coating 210 comprises at least one layer 212 deposited between the substrate 201 and the lower portion 216a of the multi-layered film 216, wherein the at least one layer 212 is used as a base layer and comprises aluminium chromium nitride and doesn't comprise boron.

Preferably the at least one base layer 212 have an element composition given by the formula $(Al_vCr_w)N$, where v>0 and w>0 are respectively the concentration of aluminium and chromium in atomic percentage if only aluminium and chromium are considered for the evaluation of the element composition in the base layer 212.

A coating according to the present invention can furthermore comprise further layers deposited for example as adhesion layers between the substrate 201 and the base layer 212 or between the substrate 201 and the lower portion 216a of the multi-layered film 216.

In a further preferred embodiment of a coating according to the present invention the coating 210 comprises at least one layer 220 deposited on the last portion 216c of the multi-layered film 216, wherein the at least one layer 220 is used as an outermost layer and comprises preferably aluminium chromium boron nitride.

Preferably the outermost layer 220 has an element composition given by the formula $(Al_xCr_yB_z)N$, where x>0, y>0 and z≥0 are respectively the concentration of aluminium, chromium and boron in atomic percentage if only aluminium, chromium and boron are considered for the evaluation of the element composition in the corresponding outermost layer 220. Depending on the application, it could be in some cases more beneficial that the boron content coefficient in the outermost layer 220 be higher than zero (z>0). According to a preferred embodiment of an inventive coating, the coefficients v and w in the base layer 212 meet the condition $1 \leq v/w \leq 4.5$.

According to a further preferred embodiment of an inventive coating, the coefficients x, y and z in the outermost layer 220 meet the conditions $1 \leq x/y = 4.5$ and/or $0.01 \leq z = 30$.

According to one more preferred embodiment of the present invention the element composition of the base layer 212 and the element composition of the B-layers is the same and/or the element composition of the top layer 220 and the element composition of the A-layers is the same.

Preferably the thickness of the base layer 212 plus the thickness of the first portion 216a of the multi-layered film 216 is about 40% to 70% of the overall thickness of the coating 210.

Preferably the inherent compressive stress in the base layer 212 is not greater than 2 GPa, as determined by XRD using the $\sin^2$ psi-method. The measurements were performed on the hkl (111) reflex, chi-range from 0 to 80° with a 5° step size. Subsequently, the peaks were fitted by a Pearson VII distribution. From the lattice distance d versus $\sin^2$ psi plot, the slope m and the axis intercept $d_i$ were extracted. With m, $d_i$ and the X-ray elastic constants $s_1$ and $\frac{1}{2}s_2$ (assumption: isotropic material) the stress was calculated.

For some applications it was observed that particularly good results can be attained by using coatings according to the present invention whose inherent compressive stress in the first portion 216a is about 2.5 GPa or lower, preferably about 1.5 GPa or lower, much preferably about 1 GPa or lower.

The inherent compressive stress in the base layer 212 should be preferably equal or lower than it in the first portion 216a.

Similarly particularly good results were observed by using coatings according to the present invention whose inherent compressive stress in the last portion 216c is about 3 GPa or higher, for some applications preferably about 4 GPa or higher.

The inherent compressive stress in the outermost layer 220 should be preferably equal or higher than it in the last portion 216c.

Preferably is the inherent compressive stress in the outermost layer 220 not higher than 8 GPa.

According to another preferred embodiment of a coating 210 according to the present invention, the outermost layer 220 exhibits a stress free lattice parameter not lower than 2.37 Å as determined by the aforementioned XRD examinations using the $\sin^2$ psi method.

Following the present invention will be described in more detail based on some exemplary cases.

Test specimens and different cutting tools e.g. hobs were coated with coatings according to the present invention according to the examples given in table 1.

TABLE 1

Bias voltage used during deposition of three different coatings according to the present invention as well as estimated thicknesses of corresponding coating layers after deposition

| Coating layer | Example 1 | | Example 2 | | Example 3 | |
|---|---|---|---|---|---|---|
| | Bias [V] | Thickness [μm] | Bias [V] | Thickness [μm] | Bias [V] | Thickness [μm] |
| 212 | −40 | 0.35 | −40 | 0.6 | −40 | 0.35 |
| 216a | −40 | 1.6 | −40 | 1.4 | −40 | 1.6 |
| 216b | | | | | −100 | 0.6 |
| 216c | −130 | 0.9 | −100 | 0.6 | −130 | 0.3 |
| 220 | −130 | 0.35 | −130 | 0.6 | −130 | 0.35 |

Figure 3A:
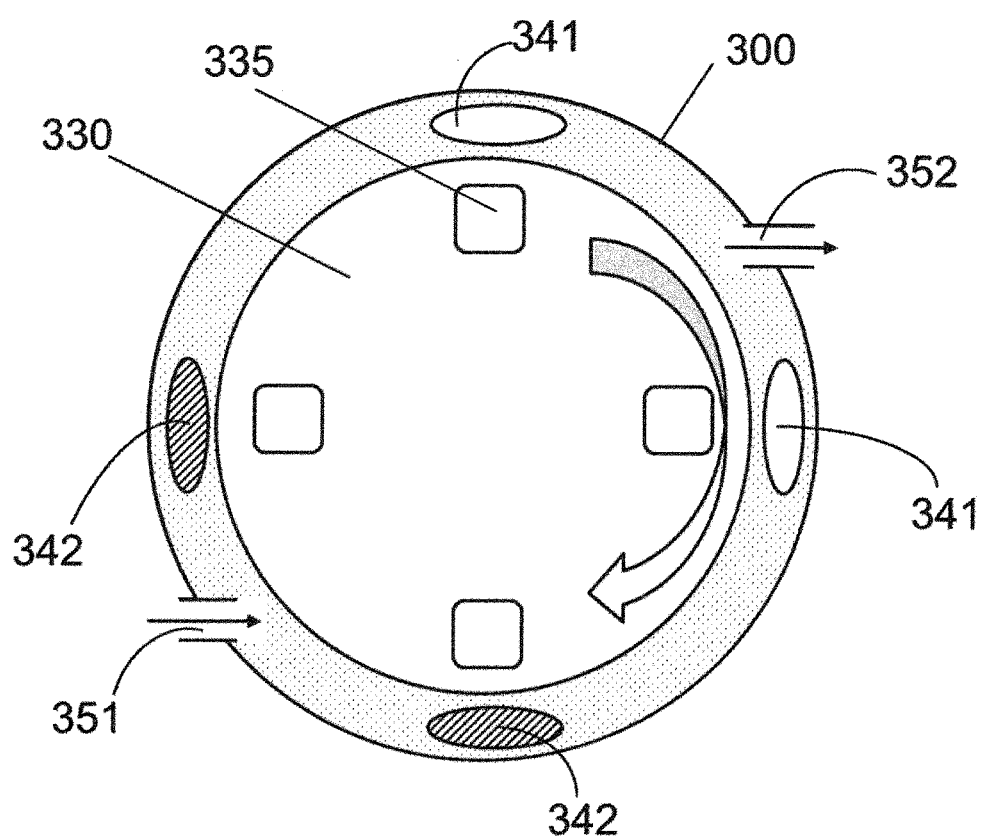

The coatings of the examples 1 to 3 where deposited by arc-evaporation of AlCr- and AlCrB-targets in a reactive nitrogen atmosphere as follow:

The coating arrangement is schematic represented in the FIGS. 3 (3a and 3b). The substrates 335 to be coated were held in substrate carriers (not drawn) which were arranged in a rotatable carrousel 330. The rotatable carrousel 330 was arranged in the middle of a vacuum chamber 300 comprising at least one AlCr-target 341 and at least one AlCrB-target 342 in such a manner that during rotation of the carrousel at least for a moment each substrate 335 alternatingly could face only the at least one AlCr-target 341 or the at least one AlCrB-target 342, and in this way the multi-layered film 216 was formed. A negative voltage was supplied to the substrate carriers during coating deposition in order to apply a negative bias voltage to the substrates 335 to be coated. In all examples 1 to 3, nitrogen was used as process gas and reactive gas at the same time. A nitrogen flow was introduced in the vacuum chamber through a gas inlet 351 and removed from the vacuum chamber through a gas outlet 352 in order to maintain a constant nitrogen pressure in the chamber of about 3-4 Pa.

Figure 3B:
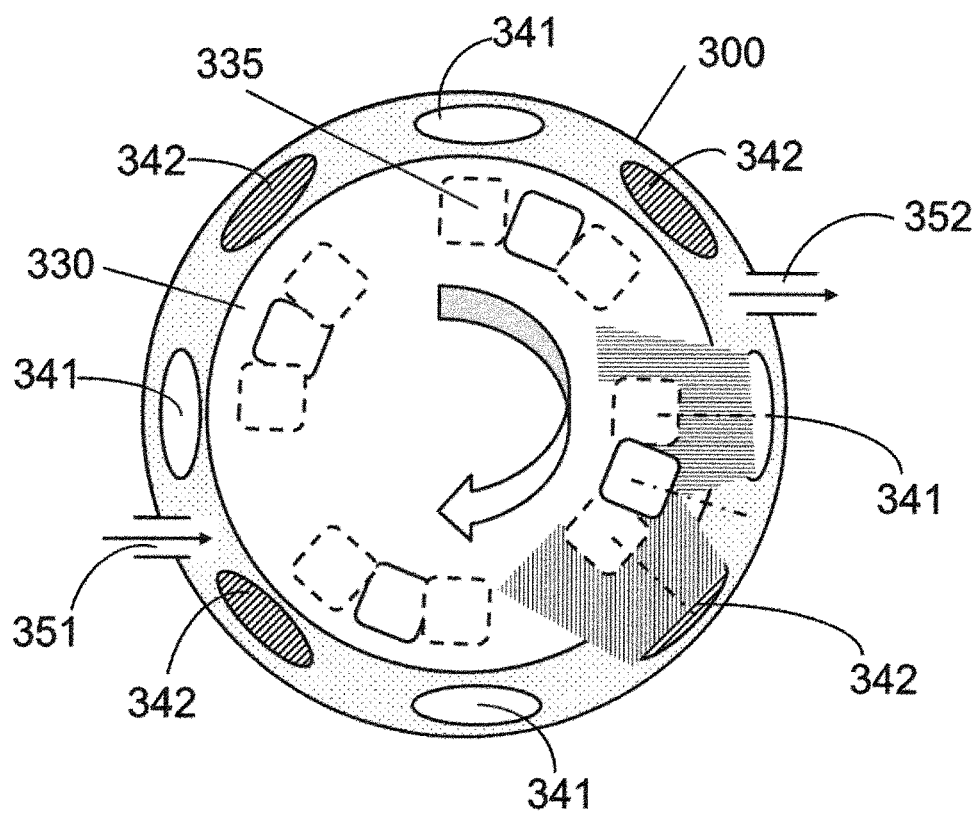

FIG. 3b shows a coating machine configuration with which it is possible that the boron content in the boron-comprising AlCrBN layers (A-layers) is varied because of the influence of the AlCr-targets. It could happen for example during film deposition in a segment of rotation where the substrate is simultaneously exposed to deposition fluxes from a AlCr-target (341) and a AlCrB-target (342). In such a case it is possible that the boron-content in the adjacent areas to the B-layers be lower than in the rest of the A-layer The coating pressure must not necessarily be in the above mentioned range (3 to 4 Pa), it can be for example in a range between 0.1 to 10 Pa depending on the characteristics of the used coating apparatus and coating configuration.

Coatings according to the present invention and methods for producing coatings according to the present invention are however not limited by the above described examples.

Coating processes for producing coatings according to the present invention can include for example the use of at least one more gas different from nitrogen which could be used as process gas during coating process e.g. argon, in this case the coating could be for example be deposited by arc-evaporation of AlCr-comprising targets 341 and AlCrB-comprising targets 342 in an argon-nitrogen atmosphere.

In the same way other coating parameters and layer thicknesses could be chosen for producing coatings according to the present invention.

According to a further preferred embodiment of a method for depositing coatings according to the present invention, the substrate to be coated undergoes a nitriding process before deposition of the coating 210. In this way particularly good mechanical stability and adhesion between substrate and coating during cutting process can be obtained.

In some applications, it may be advantageous to add further alloying elements such as tungsten (W) and/or tantalum (Ta) or to replace boron with tungsten and/or tantalum.

Coating Performance in Cutting Tests:

Single teeth tests were realized as analogy tests for simulating operational conditions in gear cutting operations. At the so called "fly cutting" tests, single teeth were eroded from a PM-HSS hob with module $m_n$=2.557 mm. Work pieces of 16MnCr5N with 30 mm width, diameter $d_a$=116 mm, inclination angle $\alpha$=17.5°, $\beta_2$=200 lead angle and 40 teeth were produced during the tests. An example for the use of such a test setup is giving by Klocke et al. in the scientific publication "Prognosis of the local tool wear in gear finish hobbing" in Prod. Eng. Res. Devel., DOI 10.1007/s11740-011-0343-9, on Sep. 21, 2011. The tests were performed at a cutting speed $v_c$=260 m/min and an axial feed rate $f_a$=4.8 mm. Flank and crater wear were measured during the progress of the tests. Each test was repeated to verify the results.

To evaluate the coating performance, state of the art coatings as well as the present coating were coated at standard PM-HSS teeth. The teeth were eroded from a standard hob with the technical data: module $m_n$=2,557 mm, pressure angle $\alpha_{n0}$=17.5°, outer diameter $d_{a0}$=110 mm, $n_i/z_0$=20/2 teeth, right hand running with tip relief modification.

The tools coated with coatings according to the present invention showed improved resistance towards crater- and flank-wear and attained about 40-60% higher tool life than state of the art AlCrN coatings and AlCrBN-based coatings according to the state of the art.

Figure 4A:
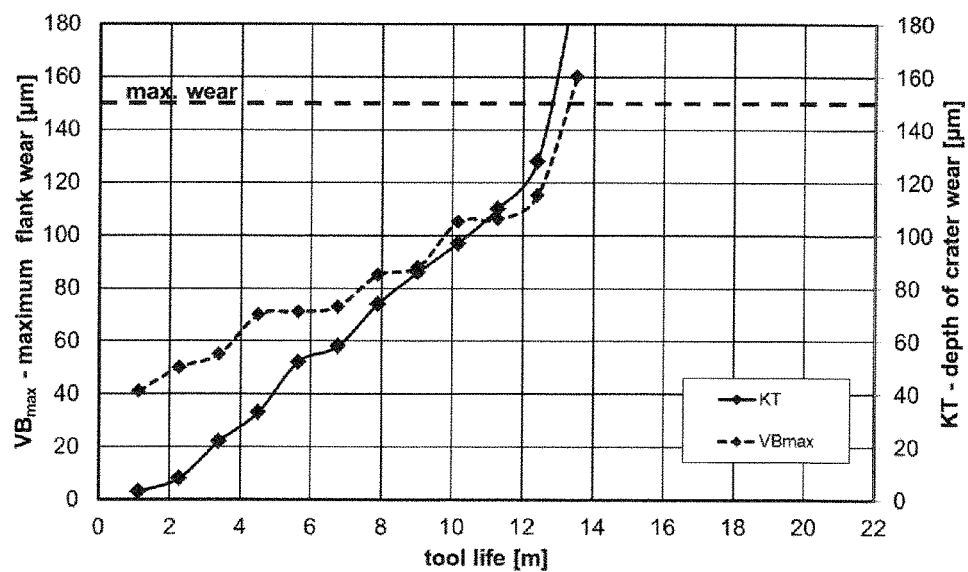
Figure 4B:
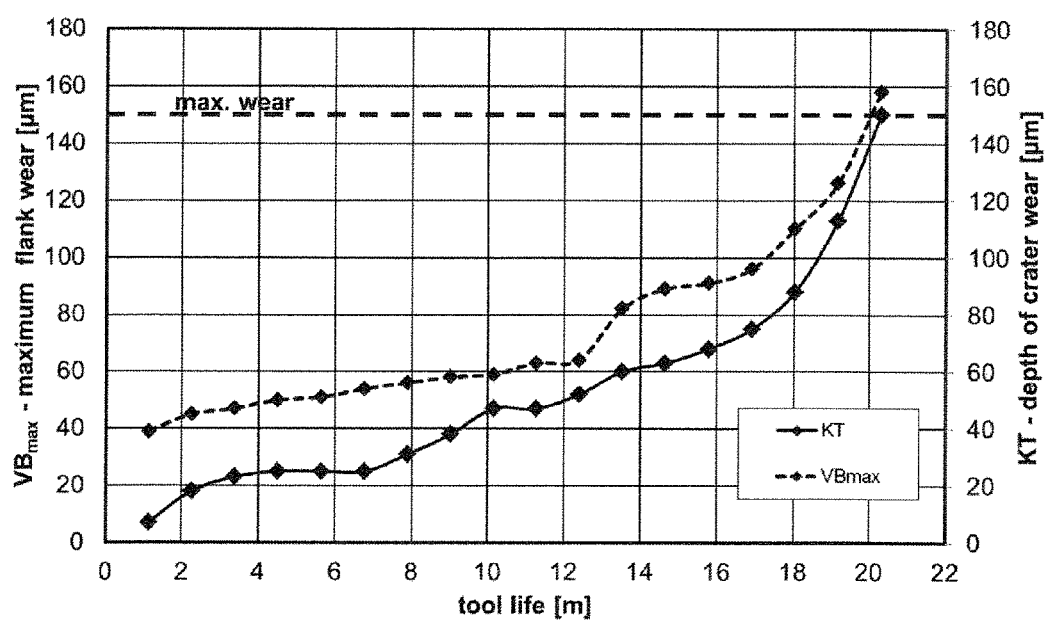

FIG. 4 shows an example of the wear evolution in a fly cutting test. FIG. 4a shows a state of the art reference AlCrN-based coating, with a tool life of 13.6 m. The present invented coating showed at the same machining conditions a nearly 50% higher tool life of 20.3 m, FIG. 4b. Each test was verified by one repetition and was executed at the above mentioned technology parameters.

Likewise the same comparative AlCrN-based coating and the same coating according to the present invention used for the accomplishment of the above described fly cutting tests were used for coating HSS hobs used in the production of ratchet wheels (20MnCr5). In this case the tools coated according to the present invention enabled an increment in cutting speed from $v_c$=200 m/min to $v_c$=300 m/min, producing the same number of parts with each tool until it was worn. This leads to a reduction in machining time and thereby increased productivity compared to using tools coated with the state-of-the-art AlCrN coating.

Figure 5A:
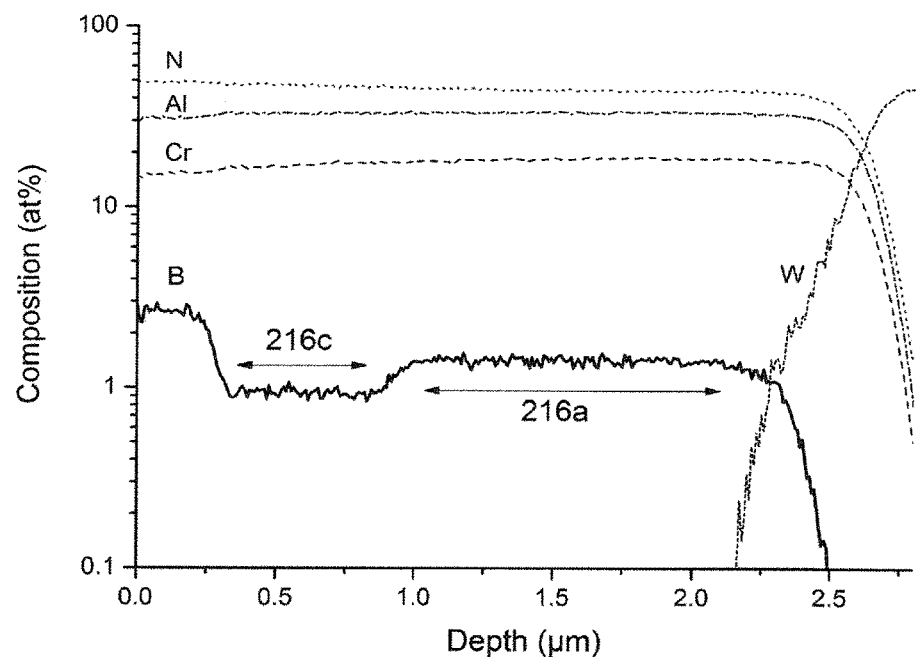
Figure 5B:
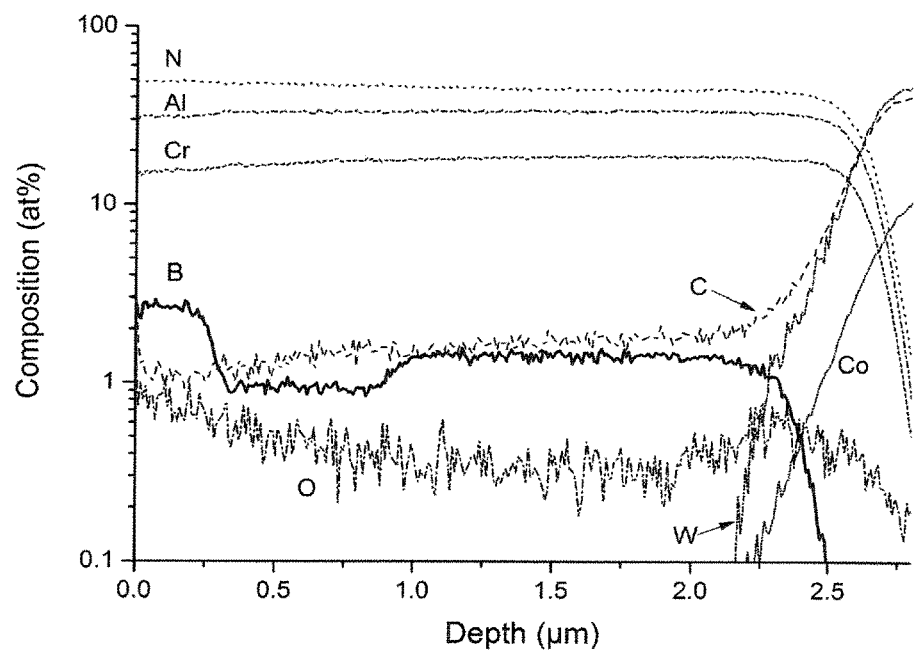

A compositional profile of the exemplary inventive coating deposited according the Example 1 is given in FIG. 5, as obtained by secondary ion mass spectrometry (SIMS) using 5 kV Cs$^+$ primary ions. The coating portions 216a and 216c are schematically indicated. FIG. 5a shows the element analysis without considering contaminations. FIG. 5b shows the element analysis considering contamination elements in the coating.

The invention claimed is:

1. A coating deposited on a surface of a substrate, the coating comprising:
   a multi-layered film comprising a plurality of A-layers and a plurality of B-layers deposited alternating one on each other forming a A/B/A/B/A . . . architecture, the A-layers comprising aluminum chromium boron nitride and the B-layers comprising aluminum chromium nitride and not comprising boron;
   the multi-layered film comprises at least a first coating portion and a last coating portion, wherein:
   the average boron content in the first coating portion is higher than the average boron content in the last coating portion,
   both the first coating portion and the last coating portion exhibit inherent compressive stresses, and
   the inherent compressive stress in the first coating portion is lower than the inherent compressive stress in the last coating portion;
   wherein the coating further comprises an outermost layer which comprises aluminum chromium boron nitride and exhibits a stress free lattice parameter not lower than 2.37 Å as determined by XRD examinations using the sin$^2$ psi method.

2. The coating of claim 1 wherein the average boron content in the first coating portion is at least 1.2-times higher than the average boron content in the last coating portion.

3. The coating of claim 2, wherein the average boron content in the first coating portion is at least 1.4-times higher than the average boron content in the last coating portion.

4. The coating of claim 1, wherein the average boron content in the first coating portion is at the most 6-times higher than the average boron content in the last coating portion.

5. The coating of claim 1, wherein the inherent compressive stress in the first coating portion is about 2.5 GPa or lower.

6. The coating of claim 1, wherein the inherent compressive stress in the last coating portion is about 3 GPa or higher.

7. The coating of claim 1, wherein the inherent compressive stress in the last coating portion is not higher than 8 GPa.

8. The coating of claim 1, wherein the A-layers in the multi-layered film have an element composition without considering contaminations which is given by the formula $(Al_xCr_yB_z)N$, where $x>0$, $y>0$ and $z>0$ are respectively the concentration of aluminum, chromium and boron in atomic percentage if only aluminum, chromium and boron are considered for the evaluation of the element composition in the corresponding A-layers.

9. The coating of claim 1, wherein the B-layers in the multi-layered film have an element composition without considering contaminations which is given by the formula $(Al_vCr_w)N$, where $v>0$ and $w>0$ are respectively the concentration of aluminum and chromium in atomic percentage if only aluminum and chromium are considered for the evaluation of the element composition in the corresponding B-layers.

10. The coating of claim 8, wherein the coefficients x, y and z in the A-layers meet the conditions $1<x/y<4.5$ and/or $0.01<z<30$.

11. The coating of claim 9, wherein the coefficients v and w in the B-layers meet the condition $1<v/w<4.5$.

12. The coating of claim 1, wherein the coating further comprises a base layer which exhibits an inherent compressive stress which is equal or lower than the inherent compressive stress in the first coating portion of the multi-layered film.

13. A method for producing the coating of claim 1, wherein at least the multi-layered film is produced by using PVD-techniques and the first coating portion and the last coating portion of the multi-layered film are deposited by using the same coating configuration including same targets, and same coating parameters excepting bias voltage.

14. The method of claim 13, wherein for depositing the first coating portion of the multi-layered film, a negative bias voltage is used which is lower in absolute value than the negative bias voltage used for depositing the last coating portion of the multi-layered film.

15. The method of claim 13, wherein at the multi-layered film is produced by arc ion plating deposition techniques.

16. A coating deposited on a surface of a substrate, the coating comprising:
a multi-layered film comprising a plurality of A-layers and a plurality of B-layers deposited alternating one on each other forming a A/B/A/B/A . . . architecture, the A-layers comprising aluminum chromium boron nitride and the B-layers comprising aluminum chromium nitride and not comprising boron;
the multi-layered film comprises at least a first coating portion and a last coating portion, wherein:
the average boron content in the first coating portion is higher than the average boron content in the last coating portion,
both the first coating portion and the last coating portion exhibit inherent compressive stresses, and
the inherent compressive stress in the first coating portion is lower than the inherent compressive stress in the last coating portion;
wherein the coating further comprises an outermost layer which comprises aluminum chromium boron nitride and exhibits an inherent compressive stress which is equal or higher than the inherent compressive stress in the last coating portion of the multi-layered film, and wherein the average boron content in the outermost layer is higher than both in the first coating portion and in the last coating portion.

* * * * *